United States Patent
Pechner (10) Patent No.: US 10,075,233 B2
(45) Date of Patent: Sep. 11, 2018

(54) DATA RETRANSMISSION FOR ATMOSPHERIC FREE SPACE OPTICAL COMMUNICATION SYSTEM

(71) Applicant: SA Photonics, Inc., Los Gatos, CA (US)

(72) Inventor: David Pechner, San Jose, CA (US)

(73) Assignee: SA Photonics, Inc., Los Gatos, CA (US)

( * ) Notice: Subject to any disclaimer, the term of this patent is extended or adjusted under 35 U.S.C. 154(b) by 0 days.

(21) Appl. No.: 14/608,166

(22) Filed: Jan. 28, 2015

(65) Prior Publication Data
US 2015/0215041 A1    Jul. 30, 2015

Related U.S. Application Data

(60) Provisional application No. 61/932,687, filed on Jan. 28, 2014.

(51) Int. Cl.
| | |
|---|---|
| *H04B 10/00* | (2013.01) |
| *H04B 10/112* | (2013.01) |
| *H03M 13/00* | (2006.01) |
| *H04L 1/18* | (2006.01) |

(52) U.S. Cl.
CPC ........ *H04B 10/1123* (2013.01); *H03M 13/00* (2013.01); *H04L 1/1845* (2013.01); *H04B 10/112* (2013.01); *H04B 10/1125* (2013.01)

(58) Field of Classification Search
None
See application file for complete search history.

(56) References Cited

U.S. PATENT DOCUMENTS

| 5,477,550 | A | * | 12/1995 | Crisler | ................. | H04L 1/1809 |
| | | | | | | 714/748 |
| 6,141,128 | A | * | 10/2000 | Korevaar | ............... | H04B 10/40 |
| | | | | | | 398/1 |
| 6,240,094 | B1 | * | 5/2001 | Schneider | ............. | H04L 1/0002 |
| | | | | | | 370/412 |
| 6,496,520 | B1 | * | 12/2002 | Acosta | ................. | H04L 1/1642 |
| | | | | | | 370/242 |

(Continued)

FOREIGN PATENT DOCUMENTS

WO    WO 2013/191435 A1    12/2013

OTHER PUBLICATIONS

Sackinger, Eduard, Broadband Circuit for Optical Fiber Communicaiton, 2002, Agere System, pp. 37-77.*

(Continued)

*Primary Examiner* — Ken N Vanderpuye
*Assistant Examiner* — Jai Lee
(74) *Attorney, Agent, or Firm* — Fenwick & West LLP (57) ABSTRACT

Exemplary embodiments described a transmission scheme for use in a bi-directional Free Space Optical (FSO) communication system. Each node locally stores a transmitted data block until and acknowledgement is received that it was properly decoded. In the event that a decode was unsuccessful, the data is retransmitted. The receiving node may then add the received signals to then attempt a decode on a combined signal. The system may also include dynamic controls such that the retransmitted signal may be optimized to improve the probability of a successful decode.

28 Claims, 4 Drawing Sheets

(56) References Cited

U.S. PATENT DOCUMENTS

| | | | |
|---|---|---|---|
| 6,683,850 B1* | 1/2004 | Dunning | H04L 1/0057 370/229 |
| 6,798,846 B2* | 9/2004 | Golitschek Edler Von Elbwart | H04L 1/0071 375/298 |
| 7,263,130 B1 | 8/2007 | Mitlin | |
| 7,277,644 B2* | 10/2007 | Johnson | H03M 13/1515 398/118 |
| 7,505,695 B2* | 3/2009 | Sugihara | H04B 10/675 398/202 |
| 7,684,329 B2* | 3/2010 | Mohanty | H04L 1/0002 370/232 |
| 7,835,387 B2* | 11/2010 | Agazzi | H03M 1/0624 370/290 |
| 8,539,297 B1* | 9/2013 | Goyal | H04L 1/1825 370/317 |
| 8,942,562 B2* | 1/2015 | Pusarla | 398/115 |
| 9,019,882 B2* | 4/2015 | Bergquist | H04L 1/1864 370/311 |
| 2002/0054411 A1* | 5/2002 | Heminger | B81B 3/0062 398/156 |
| 2002/0159545 A1 | 10/2002 | Ramesh et al. | |
| 2002/0181055 A1* | 12/2002 | Christiansen | H04B 10/1121 398/156 |
| 2003/0174696 A1* | 9/2003 | Sowizral | H04B 10/1123 370/357 |
| 2003/0202500 A1* | 10/2003 | Ha | H04L 1/0003 370/342 |
| 2006/0013189 A1* | 1/2006 | Fujimoto | H04L 1/1657 370/347 |
| 2009/0086759 A1* | 4/2009 | Heise | H04L 1/0085 370/474 |
| 2009/0122874 A1* | 5/2009 | Kolze | H04H 20/69 375/240.24 |
| 2009/0213953 A1* | 8/2009 | Yang | H04L 25/067 375/261 |
| 2010/0146354 A1* | 6/2010 | Zhang | H04L 1/0025 714/749 |
| 2011/0041041 A1* | 2/2011 | Kim | H04L 1/1819 714/780 |
| 2011/0280195 A1* | 11/2011 | Muppalla | H04L 1/0007 370/329 |
| 2012/0047408 A1 | 2/2012 | Wilborn et al. | |
| 2012/0141144 A1* | 6/2012 | Cai | H04B 10/616 398/202 |
| 2013/0107850 A1* | 5/2013 | Agiwal | H04L 1/1887 370/329 |
| 2013/0156439 A1* | 6/2013 | Arnold | 398/125 |
| 2014/0068357 A1* | 3/2014 | Georges | H04L 47/40 714/704 |

OTHER PUBLICATIONS

Kiasaleh, Kamran, Hybrid ARQ Receiver for Packet Communications over Free-Space Optical Channels, 2006, SPIE, pp. 1-12.*

Yang et al., A Hybrid Automatic Repeat Request (HARQ) with Turbo Codes in OFDM System, 2010, IEEE, pp. 1-4.*

European Extended Search Report, European Application No. 15742838.4, dated Aug. 21, 2017, 9 pages.

Australian First Examination Report, Australian Application No. 2015211019, dated Apr. 16, 2018, 4 pages.

* cited by examiner

DATA RETRANSMISSION FOR ATMOSPHERIC FREE SPACE OPTICAL COMMUNICATION SYSTEM

PRIORITY

This application claims priority to U.S. Provisional Application No. 61/932,687, filed Jan. 28, 2014, which is incorporated by reference in its entirety into this application.

STATEMENT REGARDING FEDERALLY SPONSORED RESEARCH OR DEVELOPMENT

This invention was made with government support under FA9453-09-C-0314 awarded by Air Force Research Laboratory. The government has certain rights in the invention.

BACKGROUND

Figure 1:
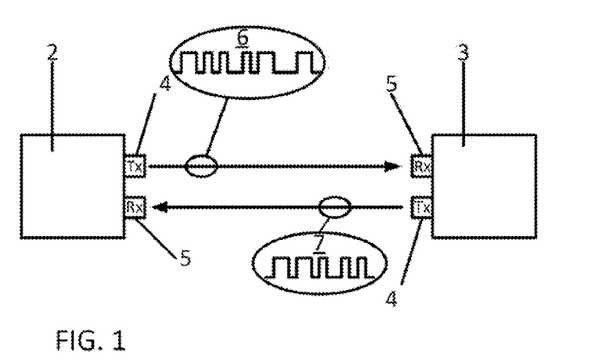
FIG. 1 illustrates an exemplary two-node bi-directional Free Space Optical (FSO) communication system.

In a two-node bi-directional Free Space Optical (FSO) communication system, the two FSO nodes exchange data encoded on optical carrier beams sent across an unobstructed line of sight (LOS) between the two nodes. As shown in FIG. 1, a conventional two-node bi-directional system is illustrated. As shown, a first node 2 and a second node 3 communication by transmitting and receiving a signal 6, 7 sent between the nodes. The data can be encoded on the signals in any matter; a binary, on-off, exemplary signal is illustrated for simplicity. Each node has an optical output 4 for transmitting the desired signal 6, 7, and also an optical input 5 for receiving the transmitted signal. Once received, the internal electronics of the node can decode the signal and obtain the transmitted data.

FSO links operating through the atmosphere are subject to the effects of scintillation. Scintillation is due to small temperature induced changes in the optical index of refraction across different portions of the optical beam as it propagates from one terminal to another. When illuminating a far end aperture, the result is widely varying received power in the aperture, typically referred to as power in the bucket. In order to provide robust and reliable data transmission with high availability and throughput, techniques are required to overcome this atmospheric induced fading.

Other approaches to provide high reliability FSO links through the atmosphere include transmitting higher optical power, the use of adaptive optics, or the use of multiple receive apertures:

Higher transmit power—By transmitting additional optical power such that even during the deepest fades there is enough received power to close the link, a robust link can be maintained. However, this is highly inefficient since a vast majority of the time the transmitter is transmitting significantly more power than is required. This increases system power consumption, system complexity and system cost.

Adaptive optics—Adaptive Optics (AO) systems attempt to measure the atmospheric induced wavefront distortion and transmit a pre-distorted wavefront such that the received optical signal at the far end terminal has reduced power fluctuations. Such systems require a wavefront sensor to measure the received waveform, a mechanism (typically a deformable mirror) to predistort the optical beam, and a control system to use the wavefront measurements to control the wavefront pre-distortion. Such approaches can provide some benefit in static conditions. However, in dynamic conditions, the limited operating bandwidth of such systems limits their usefulness. In addition, AO systems add considerable complexity to the system, adding cost and size limiting the usefulness for applications that have limited size and power requirements.

Larger apertures or Multiple receive apertures—The last approach to overcome this fading is to use larger apertures or use multiple receive apertures. If portions of the beam can be gathered at distances greater than the spatial correlation distance of the received optical beam, than these approaches will reduce the amount of fading present. However, these approaches increases system size, weight and cost, limiting their usefulness to develop compact FSO systems.

SUMMARY

Exemplary embodiments described herein use a data retransmission approach that takes advantage of the time diversity of the channel to provide high reliability, high throughput and low latency data transfer. For example, a data set is transmitted from one node to the next in block intervals. Each block interval is individually decoded and determined successful. The sending unit is notified with one or more acknowledgements that the signal was received and/or successfully decoded. If the signal was not successfully decoded, the signal for the unsuccessful block is retransmitted.

The retransmitted signal may be adaptive such that the transmitted signal parameters are based on fade statistics. For example, one or more retransmission parameters may be dynamically changed such that the retransmitted signal is more likely to be received and properly decoded. In an exemplary embodiment, the retransmitted FEC block may be delayed such that the time interval is variable to wait for temporal interference to subside. In an exemplary embodiment, the retransmitted FEC block may be transmitted at greater power. In an exemplary embodiment, the retransmitted FEC block may be at a different FEC code rate or block size.

Exemplary embodiments described herein may use soft-information and an analog-to-digital convertor based receiver that samples the incoming data and generates Log-Likelihood Ratios (LLRs) that indicate the likeliness that the received data bit was a '1' or a '0'. In addition, when a block is retransmitted for failure to decode or provide the sufficient likelihood of the received data bit, then the original and retransmitted signal may be added to provide more confidence in the decoded signal.

DESCRIPTION

The following detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. It should be understood that the drawings are diagrammatic and schematic representations of exemplary embodiments of the invention, and are not limiting of the present invention nor are they necessarily drawn to scale.

Although embodiments of this invention have been fully described herein with reference to the accompanying drawings, it is to be noted that various changes and modifications will become apparent to those skilled in the art. Such changes and modifications are to be understood as being included within the scope of embodiments of this invention as defined by the appended claims.

Exemplary embodiments described herein include a bi-directional Free Space Optical (FSO) communication unit that may be used in a multi-node FSO communication system. Embodiments described herein may be used to increase data transmission errors by retransmitting data that is not decoded with sufficient confidence.

Although embodiments of the invention may be described and illustrated herein in terms of co-boresighted free space optical communication systems, it should be understood that embodiments of this invention are not so limited, but are additionally applicable to other FSO systems such as those traditionally used with separate receive and transmit optics. Furthermore, although embodiments of the invention may be described and illustrated herein in a specific optical configuration, it should be understood that embodiments of the invention may include any optical alignment and additional optical components necessary to create the desired configuration, including beam splitters, prisms, mirrors, lenses, diffusers, diffraction gratings, and any combination thereof.

Figure 2:
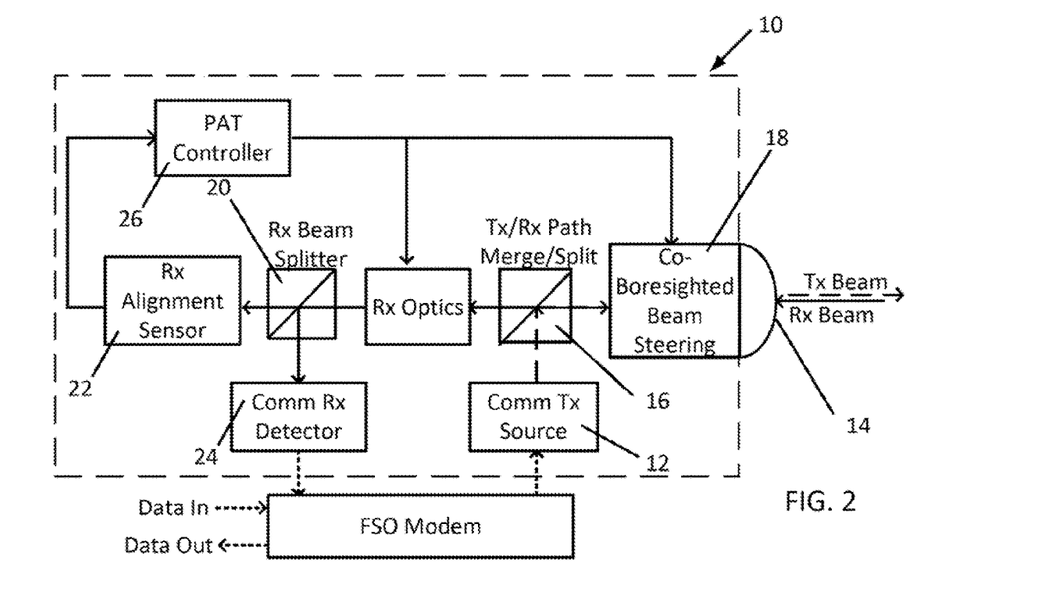
FIG. 2 illustrates exemplary bi-directional FSO communication units.

FIG. 2 illustrates an exemplary FSO unit 10 providing a common optical path for the FSO transmit (Tx) and receive (Rx) beams through a common aperture. In an exemplary embodiment, a combination of beam steering optics including, but not limited to, beam splitters, prisms, mirrors, lenses, diffraction gratings, and any combination thereof, may be used to align the received beam with the transmit beam through a common aperture.

The FSO unit 10 includes a transmitter source 12 in communication with the FSO modem that outputs an optical signal encoded with the desired data to transmit to a remote FSO unit. The optical transmit beam is directed out an aperture 14. One or more optical components may be used to steer the beam along the desired path from the transmit source through the aperture 14. As shown, the beam is directed out of the aperture through a beam merge/splitter 16.

The FSO unit 10 receives the Rx beam from the remote FSO unit through the same aperture 14 from which the Tx exited the FSO unit. The FSO unit 10 receives a wide light beam through the aperture 14. The co-boresighted beam steering unit 18 receives the Rx beam and focuses it to a smaller size for directing through the unit. The co-boresighted beam steering unit also aligns the desired incoming beam with the internal optics that are ultimately in line with the detector. The co-boresighted beam steering unit 18 may use common optical components to direct the Tx and Rx beams from the aperture to the internal optical components, such as the source and/or detector(s).

The received beam traverses the same beam merge/splitter 16. The beam merge/splitter 16 is one or more optical components that permit the Tx and Rx beams to be merged on one side such that common optical components may be used to direct and receive the Tx and Rx beams respectively through the same aperture 14 (i.e. the co-boresighted beam steering unit 18). The beam merge/splitter 16 is also configured to slit the Tx and Rx beams such that they can be generated and detected, respectively, separately. The separation of the Tx and Rx beams along a portion of their internal path within the FSO unit permits the received signal to be processed without interference of the transmitted beam. In general, the transmit beam will have a greater intensity compared to the received beam. Therefore, to prevent the transmit beam from overpowering the received signal, the beams are separated before the received signal is detected and processed, and therefore removes interference between the beams.

In an exemplary embodiment, the received beam is passed through the merge/splitter 16. For example, the merge/splitter may be a dichromic beam splitter, such that a beam at a first wavelength is reflected or redirected, while a beam at a second wavelength is transmitted or passed. As shown, the Tx beam is reflected at an angle from the incoming beam and therefore bent toward the aperture 14, while the Rx beam is passed through and proceeds to the remaining Rx optics. As such, the Tx and Rx beams are merged on the aperture side of the merge/splitter 16, and separated on different faces of the merge/splitter. The received beam is then split by a beam splitter 20 between an alignment sensor 22 and the detector 24. In an exemplary embodiment, the beam splitter 20 is a 50/50 beam splitter such that the beam is divided into two separate paths. A portion of the beam is therefore transmitted through the optic, while a second portion of the beam is reflected at an angle to the incoming beam.

Embodiments of the FSO unit may therefore comprise a system of sending data on a transmitted optical beam at a first wavelength and receiving data on a received optical beam at a second wavelength different from the first wavelength. A first set of internal optics may be used to steer both the transmitted and received beams along a portion of a path interior to the FSO unit. A second set of internal optics may be used to separate the transmit beam from the received beam for a second portion of the respective paths of the beams. A third set of internal optics may be used to generate the transmit beam having one or more characteristics, including wavelength, intensity, size, orientation, etc. A fourth set of internal optics may be used to detect the received beam and obtain the data from the optical code. A fifth set of internal optics may be used to align the system using the received beam location. The described set of optics may be one or more optics to achieve the specific functions. The set of optics may be separated into one or more additional sets of optics and/or be combined with one or more other sets of optics to achieve the same set of functions with more or less component duplication or integration. The described set of optics may be enclosed within a housing such that the internal optics are inaccessible for manual manipulation once enclosed.

Ideally, the transmit and receive beams are parallel or along the same axis when entering/exiting the aperture of the co-boresighted beam steering unit 18. The co-boresighted beam steering unit 18 is used to direct the Rx and Tx beams to/from the unit along that same path. In the illustrated embodiment, two beams (Rx and Tx) are directed through the co-boresighted aperture and into/from the FSO unit 10. The Tx and Rx beams may be different wavelengths such that they respond differently to one or more internal optical components. The exemplary embodiment separates the beams with optical components. Therefore, a portion of the Tx and Rx path lengths internal to the FSO unit are coincident and thus use the same optical components, and another portion of the Tx and Rx paths are separated. The Co-boresighted beam steering unit 18 includes optical beam steering components to direct the exiting/incoming beams such that the beams are directed toward a remote node FSO unit and still align with the internal optical components, such as the transmit source and receive detector. The Co-boresighted beam steering unit 18 may also include one or more optical components, such as filters, mirrors, lenses, etc. that may be used to manipulate the received or transmitted beams. For example, the co-boresighted beam steering unit may include optical components to receive light through the aperture 14 and focus the light to a reduced beam diameter.

When the requirements of the FSO communication system allow the Tx and Rx apertures to be the same size, the use of coboresighted Tx/Rx optics provides significant size, weight, and power (SWaP) savings as well as lower system complexity and cost compared to the use of independent Tx and Rx optical paths with double the focusing and steering elements.

The beams may be changed with respect to their respective positions or may be repositioned as desirable to fit within the FSO unit. For example, the received beam may be redirected, while the transmitted beam is redirected in another direction or passed through the beam steering optics. Additional directional optics may also be used as necessitated by the desired housing configuration.

As shown in FIG. 2*a*, the transmitted and received data is handled through the FSO modem. Data is sent and received by the FSO modem by electrical signals. The modem interacts with the transmitter source to send the data in an optical code or receives data from the receiver detector that sensed an incoming optical code. Any conventional methods of data handling and conversion may be used in conjunction with the algorithms and systems described herein. However, an exemplary embodiment used herein includes an analog to digital converter to receive an analog signal and convert to digital form for use with the algorithms herein described.

An exemplary aspect of the FSO link is the use of Hybrid-Automatic-Repeat-Request (HARQ), a physical layer retransmission scheme that is highly effective in combating fast fading channel conditions. HARQ is tightly coupled with the forward error correction (FEC) code and operates by retransmitting FEC blocks if the far end indicates an FEC block was received in error, or if a retransmission timer expires. In the case of a retransmission, the soft-bits of the originally received FEC block are held at the receiver, and the newly received soft-bits from the retransmitted FEC block are combined with them and then processed by the FEC decoder. This process not only retransmits the same data at a different time, exploiting the time diversity of the channel, but also provides up to a 3 dB Signal to Noise Ratio (SNR) combining gain. Multiple retransmissions can be used until the received FEC block is correctly decoded.

Figure 3:
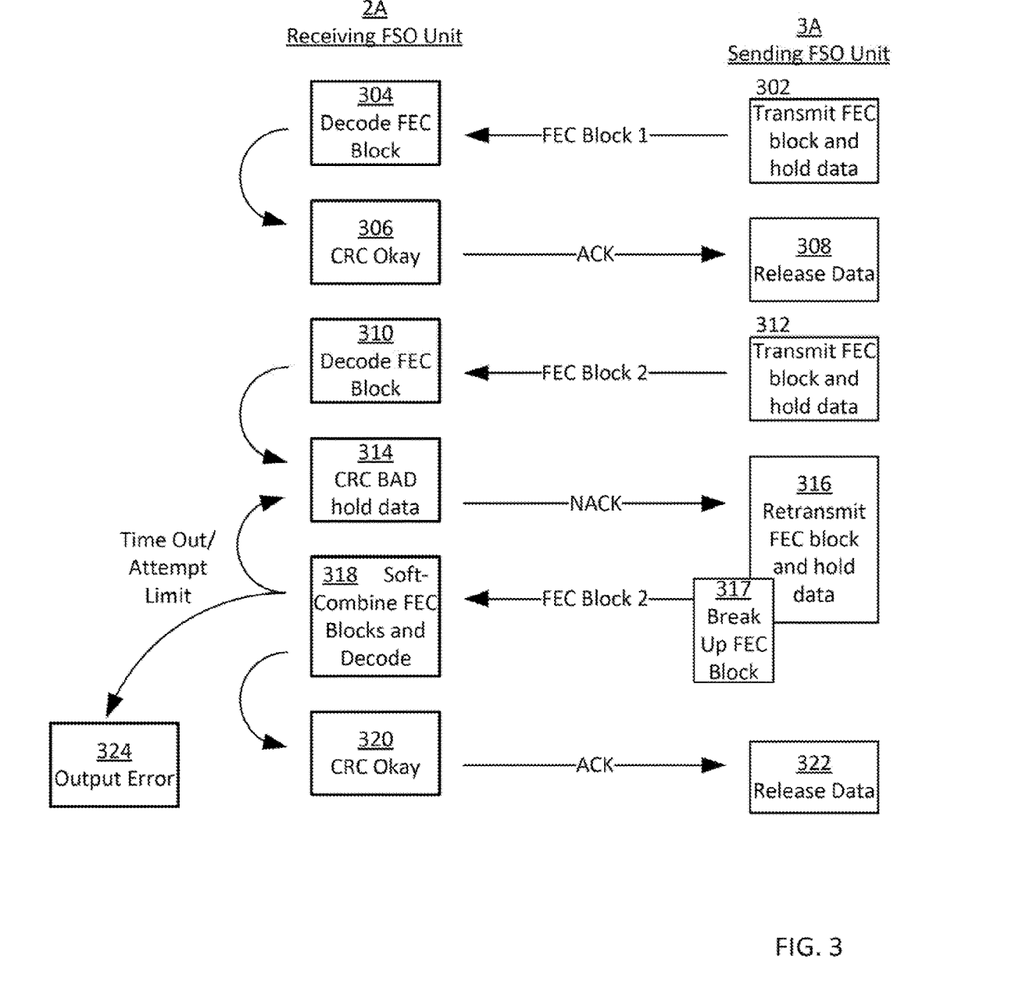
FIG. 3 illustrates an exemplary HARQ operation for optical systems as described herein.

FIG. 3 shows an example HARQ exchange. In the first exchange (steps 302-308), the received FEC block was decoded correctly, so no retransmission was needed. In the second exchange (steps 312-322), a single retransmission was needed for the FEC block to be decoded correctly. Note that since the HARQ operation is operating at the physical layer (PHY layer), the incurred latency is very small.

For example, FIG. 3 illustrates an exemplary transmission exchange from a sending FSO unit 3A to a receiving FSO unit 2A. At step 302, a first transmission of an FEC block is sent from the sending FSO Unit 3A to the receiving FSO unit 2A. The sending FSO unit decodes data on an optical signal and sends the optical transmission to be detected and decoded by the receiving FSO unit. The sending FSO unit 3A stores the data of FEC block 1 in memory unit an acknowledgement is received from the receiving FSO unit that a decode was successful. If the receiving FSO unit 2A can decode the FEC block 1 with sufficient confidence then, at step 306, the receiving FSO unit 2A sends an optical signal back to the sending FSO unit acknowledging that the decode was successful. At step 308, the FEC block 1 data is released from memory of the sending FSO unit 3A after the sending FSO unit 3A detects the acknowledgement from the receiving FSO unit 2A.

A second FEC block is then transmitted at step 308 and the FEC block 2 data saved at the sending FSO unit memory. The receiving FSO unit 2A receives the data and attempts to decode the FEC Block 2. If the receiving FSO unit did not receive a full transmission or was not able to decode the FEC block 2 with sufficient confidence, then a bad decode signal is generated, and at step 314 an acknowledgement is sent from the receiving FSO unit 2A to the sending FSO unit 3A indicating the failed transmission. The receiving FSO unit 2A saves the received signal in local memory. Upon receipt of the NACK signal, at step 316, the sending FSO unit 3A resends the same FEC block 2 data to the receiving FSO unit 2A and continues to hold the data in memory. At step 318, the receiving FSO unit combines the FEC blocks presently received and those previously stored. The combined signal is then decoded. If the decode attempt is successful, at step 320 the receiving FSO unit 2A sends and acknowledgement to the sending FSO unit 3A, and the sending FSO unit 3A releases the stored data at step 322. If the decode attempt is unsuccessful, then another NACK is sent and steps 314-318 are repeated until a successful decode is obtained, the maximum number of retries has been reached, a time-out counter has been reached, or any combination thereof. If the counter or timer limit is reached, then an error message or signal may generate, such as at step 324.

The system, algorithm, and method may also include a time out or retransmission limit such that the data transmission is not stalled at sending the FEC block. For example, the receiving FSO unit 2A and/or sending FSO unit 3A may include a counter to track the number of attempts or a relapse time for retransmitting data. Before requesting a resend or before retransmitting the FEC block, the receiving and/or sending FSO unit may verify that the retransmission limit has not been reached. If not, then a retransmission may be attempted. If the retransmission limit has been reached (for example, after three retransmissions), then the system may delay retransmission for a given amount of time in an attempt to avoid a temporally local interference, or may use another method to attempt retransmission, such as, for example, increasing power on the transmitted signal. If retransmission is not successful after a predetermined number of attempts, such as, for example, three or five attempts, then the system may generate an error and transmission is temporarily or permanently terminated.

The system, algorithm, and method may also include an automatic retransmission. For example, the sending unit may include an acknowledgement timer that tracks a given time to receive a confirmation, such as the ACK or NACK described herein. The acknowledgement timer may track the time from when a FEC block is sent to an expected receipt time. The timer limit may be set to just greater than the time to expect the acknowledgement, such as, for example, the transmission speed over the distal between the nodes summed for the round trip signals between the two nodes. If an acknowledgement is not received within the acknowledgement time limit, then the sending unit may retransmit the FEC block according to embodiments described herein. If the receiving node already received the FEC block, such that the ACK was not received, then the receiving node can disregard the transmission. If the receiving node had not previously decoded the FEC block, such that a NACK was sent, but not received at the sending node, then the receiving node can decode the retransmitted FEC block according to embodiments described herein. As described herein, the FEC block may include header information identifying the FEC block, such that the receiving node can determine if an FEC block is a previously decoded block or not.

The system may also include dynamic sending parameters, such as power, FEC block size, etc. In an exemplary embodiment, at step 317, an FEC block may be subdivided such that if a stall is encountered, the FEC block may be segmented and sent in smaller sizes that may be more successful than the larger transmission block. The delay may also be dynamic such that if the system determines a series of failed transmissions, the system may wait a predetermined amount of time before attempting another retransmission. In this case, the system may track history transmission data, or use other data, such as time of day, temperature, etc. to determine whether retransmission at a later time may be more successful. For example, the system may track use and determine that a periodic interference occurs but lasts only an order of microseconds or seconds. The system may impose a delay before retransmission when a NACK is acknowledged or after a series of NACKs are received. The power may also or alternatively be incrementally increased in an attempt to send a better signal on retransmission.

There has been considerable analysis performed to determine the optimal HARQ retransmission rate to optimize the overall data throughput for a given transmit power. Essentially, by allowing for retransmissions, the required transmit power can be reduced, conserving valuable power consumption at both the airborne and ground FSO nodes. Too low of a retransmission rate, and the node is transmitting too much power. Too high of a retransmission rate, and the retransmission begins to degrade the throughput. Based on this analysis, an optimal retransmission rate is considered to be around 20-30%. Some analysis shows up to 40% retransmission rate is optimal. For a conservative baseline a 10-20% retransmission rate is used. Accordingly, the given transmit power is selected such that a retransmit rate of 10-40%, 20-30%, or 10-20% occurs over a given time.

The system may observe the retransmit rate over a given duration, and adjust the transmit power statically, semi-statically, or dynamically to achieve the target retransmit rate. For example, the system may look at the retransmission rate for a given period preceding a given FEC block transmission and set a transmission power level to achieve a given retransmission rate. Therefore, the power may be maintained, increased, or decreased depending on the retransmission rate of a preceding duration of transmissions. The power level may also be set by a user and the retransmission rate recorded such that a user may adjust the power level based on this recorded information. The system may automatically review and adjust the transmission power at certain intervals based on the retransmission rate of a preceding interval.

Note that the overall link effect of HARQ is to reduce the fade margin of the link, which allows longer link distances to be spanned with less transmit power and smaller aperture sizes. HARQ retransmissions are very rapid with all ACK/NACK signaling performed at the PHY layer. The overall impact to the system latency is small—typically on the order of a few milliseconds.

The optimal FEC block size and retransmission rate is dependent upon the fade statistics of the channel. The FEC block size is ideally long to exploit interleaving within the FEC block. However, the FEC block should not be significantly longer than the expected mean fade duration. In addition, longer FEC blocks result in higher FEC coding gains. Thus, the longer the FEC block size that can be used, the better.

The current two most popular FEC types are block turbo-codes and low density parity check (LDPC) codes. Both are block codes that rely on iterative decoding to achieve near Shannon capacity performance. However, for larger block sizes (>1000 bits), LDPC codes can be implemented with significantly reduced complexity. In addition, the LDPC decoding algorithm lends itself to a parallel implementation, allowing for soft-decoding operation with multi-gigabit per second data rates. In an exemplary embodiment, a variety of FEC block sizes are used depending on the channel conditions. In an exemplary embodiment, block sizes can be changed on the fly. Shorter block sizes (1-2 kbit) can be used for rapidly fluctuating channels, while longer block sizes (4-16 kbit) can be used for less variable channels. The channel variations can be measured by monitoring the received optical signal strength and determining the time variability of the channel.

Exemplary embodiments described herein uses soft-information and an analog-to-digital convertor based receiver that samples the incoming data and generates Log-Likelihood Ratios (LLRs) that indicate the likeliness that the received data bit was a '1' or a '0'. This soft information approach provides additional FEC coding gain compared to a traditional hard decision decoding approach.

Figure 5A:
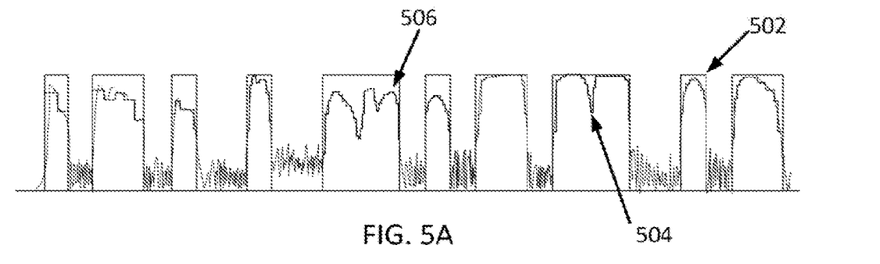
FIGS. 5A-5D illustrates an exemplary soft decode operation for optical systems as described herein.
Figure 5B:
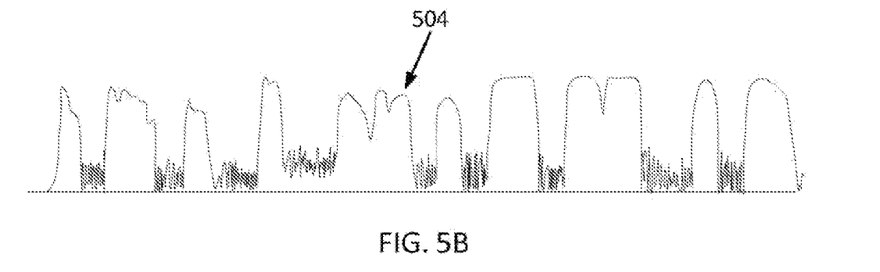

FIG. 5A illustrates an exemplary data signal as intended to be transmitted 502 and that as received 504 at an FSO detector and that as sampled and digitized 506. The actual signal includes noise from other optical sources and interference from the environment, such as atmospheric composition and temperature variations. Accordingly, the received signal is not as easy to detect and decode with confidence. The signals are illustrated overlapping for comparison in FIG. 5A and then separated in FIGS. 5B-5D.

Figure 5C:
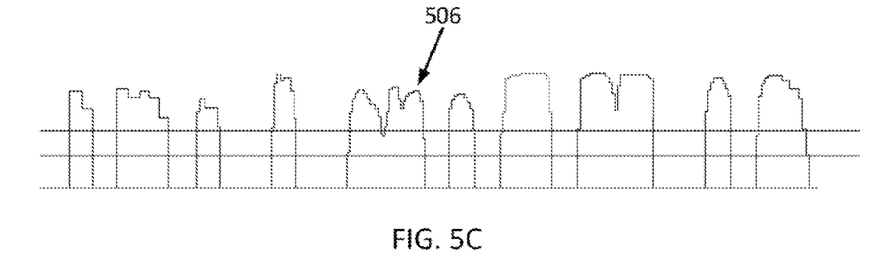
Figure 5D:
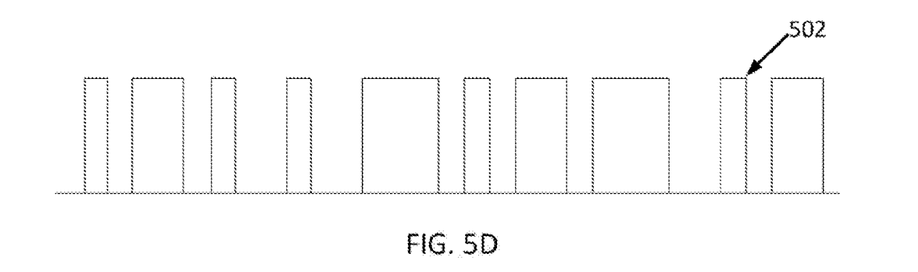

The system may compare the digitized signal at one or more sample locations along the time interval for a bit and compare to a threshold amount to determine a confidence level that the transmitted signal is an assigned symbol. For example, a 1 is assigned for signals above a threshold for a period of time and a zero is assigned for signals below the same or second threshold for a period of time. As shown in FIG. 5C two separate thresholds may be used to determine whether a signal is a 1 or a 0. If the signal falls between the two thresholds, then a sufficient confidence is not provided to assign a symbol. In addition or alternatively thereto, a confidence may be assigned based on the sampling rate and data rate. For example, if a data bit is transmitted in 5 sampling cycles, then a confidence that a bit associated with a given symbol is met if a majority or some percentage of the sampled data in the bit length falls within the confidence threshold. If the signal changes such that it is not held for the necessary time interval given the sampling rate and the data rate, or the signal is too close to the threshold, then the confidence level may not be sufficient to assign the symbol. If the confidence level is sufficiently high, then the signal is assigned the symbol. If the symbol cannot be assigned above the set threshold, then a data retransmission is necessary and will lead to a NACK being sent.

In an exemplary embodiment a ADC is used with a sampler such that a sample is taken once per duration associated with a bit length. In an exemplary embodiment a five bit ADC is used such that a signal is divided into 0-31 levels. If a signal comes in at 0, then there is a strong confidence the associated symbol is 0. If the signal comes in at 31, then there is strong confidence that the associated symbol is 1. However, if the signal comes in at 15, then the symbol is likely a 0, but the confidence is very low. The FEC algorithm may fix the bits with the least confidence first. In an exemplary embodiment the LLR is used by comparing the ratio of the likelihood of a 0 to the likelihood of a 1 and then taking the log. Accordingly, a positive number indicates a 0 and a negative number indicates a 1 and the higher the number, the more confident the determination. Exemplary embodiments may use 4-12 bit ADC, such that the granularity of the confidence may be controlled between 16 to 4096 levels.

If a retransmission occurs, the original analog signal or the converted digital signal may be added together to make the retransmission total signal that is then compared to the same or different threshold values. In an exemplary embodiment, the LLR values are stored and added together to create a new retransmission total signal.

Header information may be used and appended to each FEC block. The FEC header includes a FEC block ID for the FEC block being transmitted and ACK/NACK bits for previously received FEC blocks. In an exemplary embodiment, the headers are encoded using a stronger FEC code and with repetition to allow for correct decoding of header information even when FEC blocks cannot be decoded. In addition, a state machine with timers may be used to take into account lost header information.

Figure 4:
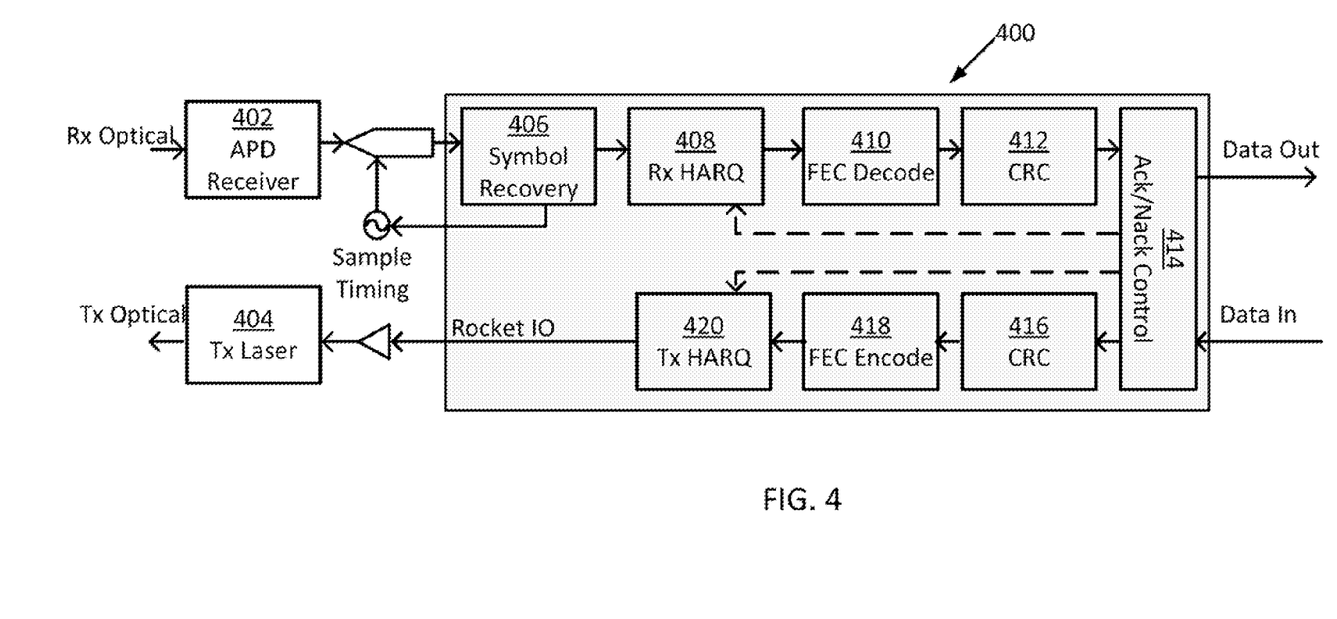
FIG. 4 is an exemplary Field Programmable Gate Array interconnected with FSO Unit Components to achieve the HARQ operation of FIG. 3.

FIG. 4 illustrates an exemplary Field Programmable Gate Array (FPGA) 400 interfacing with other system components to achieve the functions described herein. For example, the FPGA 400 interfaces with the receiver 402 and transmitter 404 to receive and send data across optical signals. The FPGA 400 may also receive and send data in the form of electrical signals, such as data bits, that are decoded through the FPGA to/from the optical receiver/transmitter. The FPGA 400 includes a number of exemplary components for accomplishing the data coding and HARQ methods described herein.

In an exemplary embodiment, the FPGA 400 receives an optical signal that it detected by receiver, such as APD receiver 402. The receiver 402 sends electrical signals to the FPGA 400 that correspond to the received optical signals. The FPGA therefore includes a symbol recovery 406 that filters, amplifies, digitizes, or otherwise prepares the electronic signal for manipulation. After the symbol recovery 406, the Rx HARQ 408, FEC Decode 410, CRC 412, and Ack/Nack Control 414 work in conjunction to determine whether a new block is being sent or whether a retransmission is sent, determine if a time out or retransmission limit has been reached, add the received signals of retransmitted blocks, decode the FEC block, confirm whether a decode was successful or not, and determine what acknowledgement should be returned.

In an exemplary embodiment, the system includes an analog to digital converter to take the analog signal from the receiver and convert it to a digital signal. The system also includes a sampler to set the sample rate of conversion.

In an exemplary embodiment, the FPGA 400 sends an optical signal that is transmitted by Tx laser 404. The Ack.Nack Control 414, CRC 416, FEC encoder 418, and Tx HARQ 420 work in conjunction to send a proper acknowledgement, append an appropriate header, encode the desired data into the FEC block, and determine whether a time out has been reached or retransmission limit, and send an appropriate error or data transmission.

The transmitter state machine can operate independently for each FEC block ID and may include: a timer that when expired, retransmits a FEC block assuming a ACK/NACK was not received; and a counter to limit the maximum number of times a FEC block is retransmitted.

Each FEC block and header has a calculated Cyclic Redundancy Check (CRC) that is used to indicate if the data has been decoded correctly. If an FEC block is decoded correctly, the bit values are calculated from the LLR data, the bit values then are tagged for output. An output reordering state machine is used to output decoded data in proper sequence.

At the receiver, a timer is used for each FEC block that had not been decoded successfully to determine the maximum amount of time the block is held without being output. If the timer expires, the FEC block is decoded with errors and output.

HARQ operation can use memory at both the transmitter and receiver. At the transmitter, bit values of encoded FEC blocks are stored and retransmitted as needed. At the receiver, calculated LLR for received FEC blocks are stored. As retransmitted FEC blocks are received, the new LLR values are added to the stored LLR values and the updated LLR values are stored if the FEC block is not decoded correctly.

A memory manager at both the transmitter and receiver can be used to manage FEC block memory to efficiently utilize memory and maximize the number of FEC blocks that can be stored with a given memory size.

By exploiting the time diversity of the channel, robust and reliable FSO data transmission through the atmosphere is possible while avoiding the power, size and cost disadvantages of other options. This enables use in applications that require small size and power.

Some portions of the detailed descriptions above are presented in terms of algorithms. These algorithmic descriptions are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical, optical, and/or magnetic signals capable of being stored, transferred, combined, compared, and otherwise manipulated. It has proven convenient at times, principally for reasons of common usage, to refer to these signals as bits, values, elements, symbols, characters, terms, numbers, or the like. The signals may be stored as machine readable code on a memory device and executed by a processor to perform the described functions.

Accordingly, for example, the FSO unit may include a system processor, memory, and a plurality of software routines stored on the memory and executed by the processor to perform the algorithms and methods described herein. The processor and memory may be within the PAT controller for example. The FSO unit may also include input and/or output circuitry to enable a user to interface with the FSO unit.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims. For example, a number of exemplary embodiments are disclosed including one or more features, components, or functions. These features, components, or functions may be duplicated, combined, removed, or separated, such that any combination of described embodiments are within the scope of the present invention

The invention claimed is:

1. A method of communicating through a free space optical (FSO) system, comprising:
    sending a first optical signal, including a header, a data block, and a cyclic redundancy check from a sending FSO node and storing data corresponding to the first optical signal in a first memory of the sending FSO node;
    decoding the first optical signal by a receiving FSO node to determine a possible symbol assignment for the first optical signal;
    determining a first level of confidence of the possible symbol assignment for the decoded optical signal;
    sending a retransmission request, in a header of a second optical signal, by the receiving FSO node if the first level of confidence is below a threshold level, wherein the second optical signal is sent with forward error correction (FEC) code and the header is transmitted with a higher FEC coding gain than a data block of the second optical signal;
    waiting a delayed time interval, by the sending FSO node, before sending a third optical signal in response to the retransmission request, wherein the delayed time interval is based on channel conditions;
    sending the third optical signal corresponding to the data stored in the first memory by the sending FSO node;
    decoding the third optical signal by the receiving FSO node to determine the possible symbol assignment for the third optical signal;
    determining a second level of confidence of the possible symbol assignment for the decoded third optical signal; and
    sending a transmission confirmation by the receiving FSO node if the second level of confidence is above the threshold level, the transmission confirmation confirming the possible symbol assignment.

2. The method of claim 1, wherein the first optical signal comprises packets including a data block, a header identifying the data block, and a cyclic redundancy check used to determine the first level of confidence.

3. The method of claim 1, further comprising:
    converting the first optical signal by a receiving FSO node to a first analog electrical signal;
    sampling the first analog electrical signal with an Analog-to-Digital convertor at the receiving FSO node to create a first sampled digital signal;
    converting the third optical signal by the receiving FSO node to a second analog electrical signal;
    sampling the second analog electrical signal with the Analog-to-Digital convertor at the receiving FSO node to create a second sampled digital signal;
    digitizing the first sampled digital signal by assigning a multi-bit value for each sample based on threshold values to create a first digitized sampled electrical signal;
    digitizing the second sampled digital signal by assigning a multi-bit value for each sample based on threshold values to create a second digitized sampled electrical signal; and
    adding the second digitized sampled electrical signal to the first digitized sampled electrical signal by the receiving FSO node to define a combined electrical signal.

4. The method of claim 3, further comprising converting the first digitized sampled electrical signal into a first scaled digital signal using a log likelihood ratio, storing the first scaled digital signal in a first memory of the receiving FSO unit, converting the second digitized sampled digital signal into a second scaled digital signal using a log likelihood ratio, adding the second scaled digital signal to the first scaled digital signal to define the combined electrical signal, and decoding the combined electrical signal to determine the second level of confidence.

5. The method of claim 1, wherein the sending a first optical signal is at a first transmit power, the transmit power selected to achieve a 10-20 percent retransmission rate.

6. The method of claim 1, wherein the channel conditions comprise channel fade statistics.

7. The method of claim 1, wherein the third optical signal is sent at increased power than the first optical signal.

8. The method of claim 1, wherein the third optical signal is sent at a delayed time according to a predetermined interval based on historical channel conditions.

9. The method of claim 1, wherein the third optical signal is sent at a delayed time that is based on historic channel conditions observed at the sending FSO node.

10. The method of claim 1, wherein the retransmission request is handled at a PHY layer of the receiving FSO unit.

11. The method of claim 1, wherein the optical signals are divided into blocks before they are sent, the block sizes depending on the channel conditions.

12. The method of claim 11, wherein the block sizes are changed in real time according to the channel conditions.

13. The method of claim 1, wherein the channel conditions are measured by monitoring a received optical signal strength and determining a time variability of the channel.

14. The method of claim 1, wherein the optical signals are only sent between the sending FSO node and the receiving FSO node.

15. The method of claim 1, wherein if the sending FSO node does not receive an acknowledgment request or a retransmission request within a threshold time after sending an optical signal, then the sending FSO will send another optical signal corresponding to the optical signal.

16. A Free Space Optical (FSO) communication system, comprising:
    a first FSO unit having:
    a first optical transmitter for sending a retransmission optical signal comprising a retransmission request located within a header of the retransmission optical signal, wherein the retransmission optical signal is sent with forward error correction (FEC) code and the header is transmitted with higher FEC coding gain than a data block;
    a first optical detector for receiving a transmit optical signal;
    a first processor configured to decode the received optical signal to determine a possible symbol assignment for the transmit optical signal,
determine a first level of confidence of the possible symbol assignment for the transmit optical signal, and
instruct the first optical transmitter to send the retransmission optical signal if the first level of confidence is below a threshold level; and
a first memory for storing a data block; and
a second FSO unit having:
a second optical transmitter for transmitting the transmit optical signal and a retransmitted optical signal;
a second optical detector for receiving the retransmission optical signal;
a second processor for decoding the retransmission optical signal; and
a second memory for storing a transmitted data block, wherein the second FSO unit is configured to send the retransmitted optical signal corresponding to the transmit optical signal when the second FSO unit receives the retransmission request in the header of the retransmission optical signal, wherein the retransmitted optical signal is sent at a delayed time according to an interval based on channel conditions.

17. The FSO communication system of claim 16, wherein the transmit optical signal comprises packets including a header identifying the packet, a data block, and a cyclic redundancy check used to determine the first level of confidence.

18. The FSO communication system of claim 16, wherein the first optical detector converts the transmit optical signal by digitizing the transmit optical signal and assigning a bit value based on a threshold value.

19. The FSO communication system of claim 16, wherein the first optical detector converts the transmit optical signal to a first electrical signal, the first electrical signal stored in the first memory, and is configured to receive the retransmitted optical signal and convert the retransmitted optical signal to a second electrical signal and add the second electrical signal to the first electrical signal stored in the first memory to create a combined signal, wherein the first FSO unit is configured to decode the combined signal with a second level of confidence.

20. The FSO communication system of claim 19, wherein the first FSO unit further comprises an analog to digital converter to convert an analog electrical signal from the first optical detector to a digital electrical signal for processing by the first processor, the first FSO unit configured to sample the transmit optical signal once per bit length to obtain a received sampled signal, convert the received sampled signal into a digital electrical signal, convert the digital electrical signal into a scaled digital signal using a log likelihood ratio, store the scaled digital signal in the first memory, sample the received retransmitted optical signal once per bit length to obtain a second received sampled signal, convert the second received sampled signal into a second digital electrical signal, convert the second digital electrical signal into a second scaled digital signal using a log likelihood ratio, add the second scaled digital signal to the scaled digital signal to define the combined signal, and decode the combined signal with the second level of confidence.

21. The FSO communication system of claim 19, wherein the first FSO unit uses a header to confirm the retransmitted optical signal is a retransmission of the transmitted optical signal before creating the combined signal.

22. The FSO communication system of claim 16, wherein the interval based on channel conditions is determined based on historic conditions observed at the first FSO unit.

23. The FSO communication system of claim 16, wherein the retransmission request is handled at a PHY layer of the first FSO unit and the second FSO unit is configured to send the retransmitted optical signal corresponding to the transmit optical signal when the second FSO unit fails to receive an acknowledgement request or a retransmission request from the first FSO unit after a threshold amount of time.

24. The FSO communication system of claim 16, wherein the optical signals are divided into blocks before they are sent, the block sizes depending on the channel conditions.

25. The FSO communication system of claim 24, wherein the block sizes are changed in real time according to the channel conditions.

26. The FSO communication system of claim 16, wherein the channel conditions are measured by monitoring a received optical signal strength and determining a time variability of the channel.

27. The FSO communication system of claim 16, wherein the optical signals are only sent between the first FSO unit and the second FSO unit.

28. The FSO communication system of claim 16, wherein the retransmission optical signal is sent at a delayed time according to a predetermined interval based on historical channel conditions.

* * * * *